(12) United States Patent
Borri

(10) Patent No.: US 8,020,115 B2
(45) Date of Patent: Sep. 13, 2011

(54) APPARATUS, METHOD AND SYSTEM FOR PERMANENT STORAGE OF DATA

(75) Inventor: Simone Borri, Valbonne (FR)

(73) Assignee: Infineon Technologies AG, Neubiberg (DE)

( * ) Notice: Subject to any disclaimer, the term of this patent is extended or adjusted under 35 U.S.C. 154(b) by 1191 days.

(21) Appl. No.: 11/784,691

(22) Filed: Apr. 9, 2007

(65) Prior Publication Data

US 2008/0250296 A1 Oct. 9, 2008

(51) Int. Cl.
*H03M 13/00* (2006.01)
(52) U.S. Cl. .................................. 715/785; 714/758
(58) Field of Classification Search .................. 714/758, 714/763, 785
See application file for complete search history.

(56) References Cited

U.S. PATENT DOCUMENTS

| | | | | |
|---|---|---|---|---|
| 5,691,994 A | * | 11/1997 | Acosta et al. | 714/784 |
| 6,041,430 A | * | 3/2000 | Yamauchi | 714/752 |
| 6,052,815 A | * | 4/2000 | Zook | 714/758 |
| 6,400,292 B1 | | 6/2002 | Maeno | |
| 6,871,314 B2 | * | 3/2005 | Ohira et al. | 714/776 |
| 6,938,193 B1 | | 8/2005 | Honda | |
| 7,475,329 B2 | * | 1/2009 | Hassner et al. | 714/785 |
| 7,530,009 B2 | * | 5/2009 | Katoh et al. | 714/785 |
| 7,653,862 B2 | * | 1/2010 | Hassner et al. | 714/767 |
| 7,694,208 B2 | * | 4/2010 | Ball | 714/784 |

OTHER PUBLICATIONS

C.L. Chen and M.T. Hsiao, "Error-Correcting Codes for Semicondcutor Memory Applications: A State-of-the-Art Review", IBM J. Res. Develop., vol. 28, N. 2, pp. 124-134, Mar. 19.
K. Gray, "Adding Error-Correcting Circuitry to ASIC Memory", IEEE Spectrum, pp. 55-60, Apr. 2000.

\* cited by examiner

*Primary Examiner* — Esaw T Abraham

(57) ABSTRACT

A plurality of first storage elements store data. A plurality of second storage elements store an error correcting code based on a data sub-string of the data. A syndrome is generated based on the first and second storage elements. An erroneously programmed content of the first storage elements is corrected based on the syndrome.

12 Claims, 6 Drawing Sheets ered content of the data storage element 101 and the CRC storage

APPARATUS, METHOD AND SYSTEM FOR PERMANENT STORAGE OF DATA

TECHNICAL FIELD

The information disclosed herein relates generally to a semiconductor device and a system having a permanent data storage element, and a method of storing data permanently.

BACKGROUND

As semiconductor devices contain more and more permanent data storage elements the probability of failure occurring in the semiconductor device due to wrongly programmed data storage elements increases. It is necessary for such a semiconductor device to have an error correction mechanism to enhance the reliability and the data integrity of the semiconductor device.

DETAILED DESCRIPTION

Many of the various disclosed embodiments relate to an apparatus, a method and a system for permanent storage of data. Specific details of certain embodiments of the invention are set forth in the following description and in FIGS. 1 through 8 to provide a thorough understanding of such embodiments. One skilled in the art, however, will understand that other embodiments are possible, and that many embodiments may be practiced without several of the details described herein. The following disclosure relates in general to storing data permanently in storage elements and during reading the data from the storage elements detecting and correcting the data bits that were programmed erroneously.

A cyclic redundancy check (CRC) code is a checksum that may be used to detect an erroneously programmed content of storage elements.

An error-correcting code (ECC) may be used to detect and to correct the erroneously programmed content of storage elements. There are various classes of error-correcting codes depending on error correction capabilities and area overhead. A single-error-correcting (SEC) code can be used to identify and correct any single bit error in storage elements. A single-error-correcting double-error-detecting (SEC-DED) code can be used to identify and correct any single bit error in storage elements and to identify two bit errors. Many schemes with higher error correction capabilities also exist but they have a larger impact in terms of area overhead. For example, a double-error-correcting triple-error-detecting (DEC-TED) code can be used to identify and correct any two bit errors in storage elements and to identify three bit errors. However, compared to a SEC-DED code this type of code requires a larger number of check bits and more complex hardware to implement the function of error correction and error detection. For example, for a 128-bit data word the SEC-DED code requires 9 check bits whereas the DEC-TED code requires 17 check bits.

When using a CRC code and an ECC code, e.g. a SEC-DED code, together, the error-detecting capability of the SEC-DED code may not be required. For example, a simpler SEC code may be employed which has the same efficiency in terms of error correction and further reduces the code overhead by one bit compared to the equivalent SEC-DED code.

Figure 1:
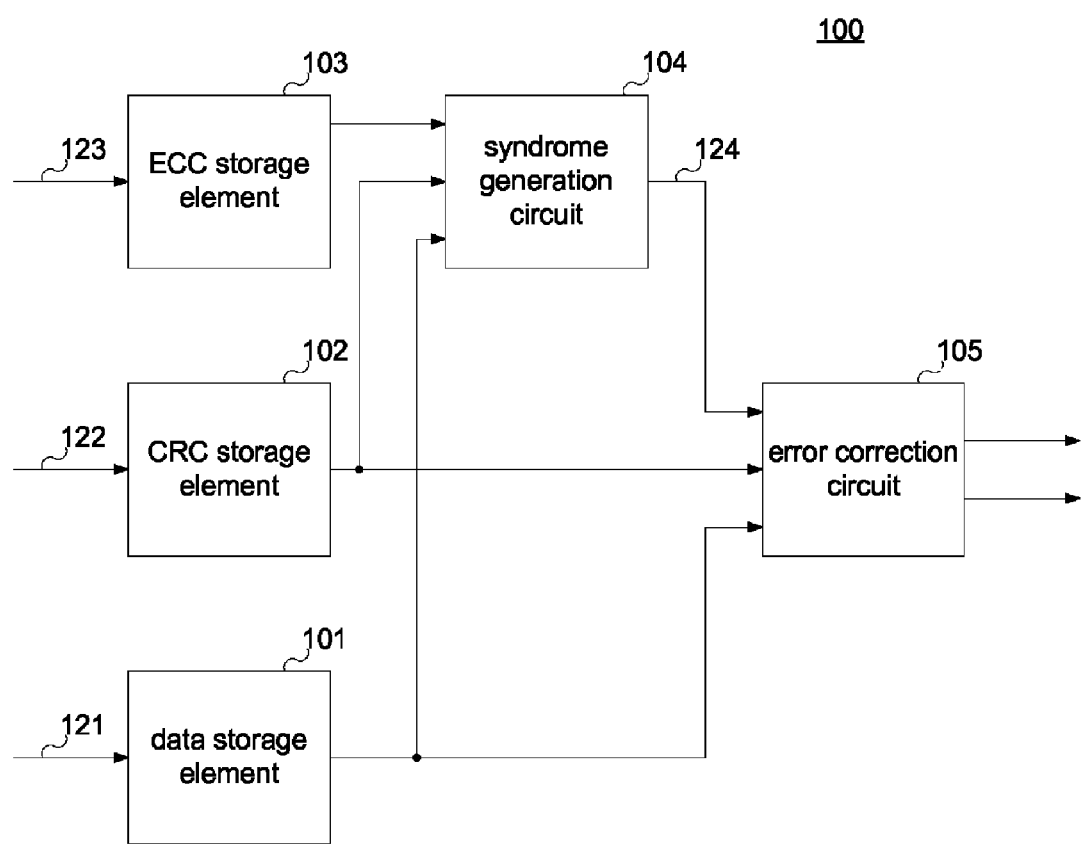
FIG. 1 shows an embodiment of an apparatus for permanent storage of input data in a data storage element according to the present invention.

Referring to FIG. 1, an apparatus 100 for permanent storage of input data 121 in a data storage element 101 is shown. A CRC code 122 is computed based on the input data 121 that are written to the data storage element 101. The CRC code 122 may be used to detect erroneously programmed content of the data storage element 101. The CRC code 122 is stored in a CRC storage element 102. An ECC code 123 is computed based on the input data 121 that are written to the data storage element 101 and based on the CRC code 122 that is written to the CRC storage element 102. The ECC code 123 may be used to detect and to correct an erroneously programmed content of the data storage element 101 and the CRC storage element 102. The ECC code 123 is stored in an ECC storage element 103.

In a syndrome generation circuit 104 the check bits, also called syndrome 124, are generated based on the content of the data storage element 101, the CRC storage element 102 and the ECC storage element 103. The syndrome 124 thus generated is used in an error correction circuit 105 to determine whether one or several bit errors have occurred in the data storage element 101 and in the CRC storage element 102 and to correct the one or more errors.

Figure 2:
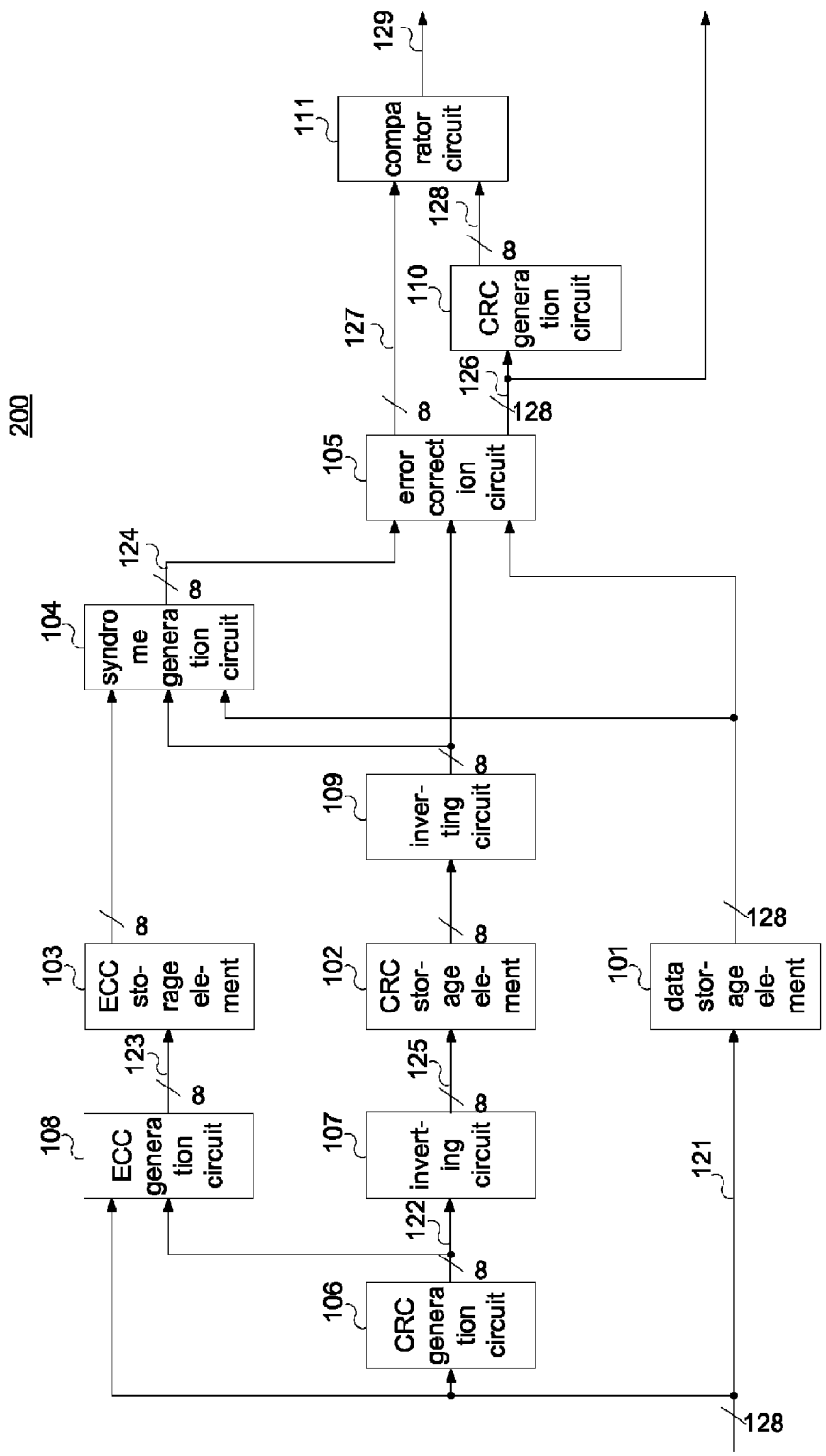
FIG. 2 shows an embodiment of an apparatus for permanent storage of a 128-bit data word according to the present invention.

Referring to FIG. 2 an apparatus 200 for permanent storage of a 128-bit data word is shown. The 128-bit input data 121 is stored permanently in a data storage element 101. An 8-bit CRC code 122 is computed by CRC generation circuit 106 based on the 128-bit input data word 121. The CRC code is used to decrease the probability of undetected programming errors of data storage element 101. The CRC code 122 is stored in a CRC storage element 102. Alternatively, the CRC code 122 may be inverted by an inverting circuit 107 and the inverted 8-bit CRC code 125 may be stored in the CRC storage element 102. With the help of the inversion it is ensured that at least one bit of the storage elements is programmed with '1' even when the input data word 121 is all '0's. Therefore the inversion of the CRC code can be used to neutralize the effects of a complete programming failure of the storage elements. An 8-bit ECC code 123 is generated in an ECC generation circuit 108 based on the 128-bit input data word 121 and the 8-bit CRC code 122. By generating the ECC code based on both the input data word 121 and the CRC code 122 it is possible to correct an error not only for the data word but also for the CRC string. Therefore it is possible to reduce the risk of false error detection due to an error in the CRC bits.

The 8-bit ECC code 123 may be a SEC code that is used to identify and correct any single bit error. Alternatively, a 9-bit SEC-DED code can be used to identify and correct any single bit error and to identify two bit errors in the data storage element 101 and CRC storage element 102. An 8-bit wide syndrome 124 is generated based on the contents of the data storage element 101, the CRC storage element 102 and the ECC storage element 103. The generation of the syndrome 124 may be performed by a separate syndrome generation circuit 104. Instead the apparatus 200 may be configured in a way that the ECC code 123 and the syndrome 124 may be generated by a shared circuit.

If the inverted CRC code 125 is stored in the CRC storage element 102 the syndrome 124 needs to be generated based on the inverted content of the CRC storage element 102. For the inversion a separate inverting circuit 109 may be used. Alternatively, the inverting circuit 107 may be configured in a way that it performs both the inversion of the CRC code 122 and the inversion of content read out of the CRC storage element 102 in one circuit.

In error correction circuit 105, the syndrome 124 is used to determine whether bit errors have occurred in the data storage element 101 and in the CRC storage element 102. With the help of the SEC-DED code any two bit errors can be identified and any single bit error can be identified and corrected by the error correction circuit 105. The corrected 128-bit data word 126 is provided as output of the apparatus 200. Furthermore a corrected 8-bit CRC code 127 is generated by the error correction circuit 105.

In order to increase the error detection capabilities of the apparatus 200 the corrected 8-bit CRC code 127 may be compared with a CRC code 128 that is computed by a CRC generation circuit 110 based on the corrected 128-bit data word 126. The CRC generation circuit 110 may be separate circuit or it may be shared circuit. In case of shared circuit, the CRC code 122 that is based on the 128-bit input data word 121 is generated by the same circuit as the CRC code 127 that is based on the corrected 128-bit data word 126. In a comparator circuit 111 the corrected CRC code 127 is compared with the CRC code 128 and an error flag 129 indicates whether one or more errors were detected in the corrected data word 126 or in the corrected CRC code 127.

In order to be able to correct several bits, an input data word may be partitioned in several data sub-strings and for each data sub-string an error correction may take place. An N-bit input data word may be partitioned in K data sub-strings of equal length W. Alternatively the length of the data sub-strings may not be equal for all the data sub-strings. Also it is possible that not for all data sub-strings an error correction may take place.

Figure 3:
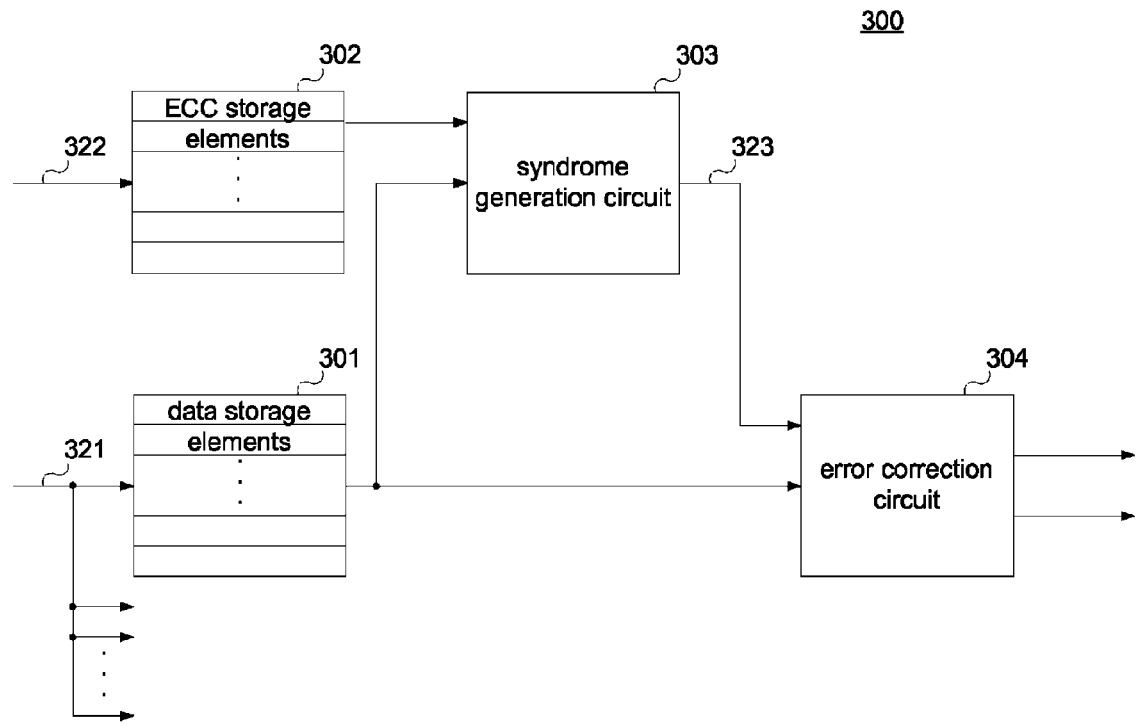
FIG. 3 shows an embodiment of an apparatus for permanent storage of input data in data storage elements according to the present invention.

Referring to FIG. 3 an apparatus 300 for permanent storage of input data 321 in data storage elements 301 is shown. The input data 321 is divided up into data sub-strings and an ECC code 322 is computed for a data sub-string based on the corresponding data sub-string. The ECC code 322 is stored in ECC storage elements 302.

In syndrome generation circuit 303 a syndrome 323 is generated based on the content of the data storage elements 301 and the ECC storage elements 302. The syndrome 323 is used in an error correction circuit 304 to determine whether bit errors have occurred in the data storage elements 301 and to correct these errors.

Figure 4:
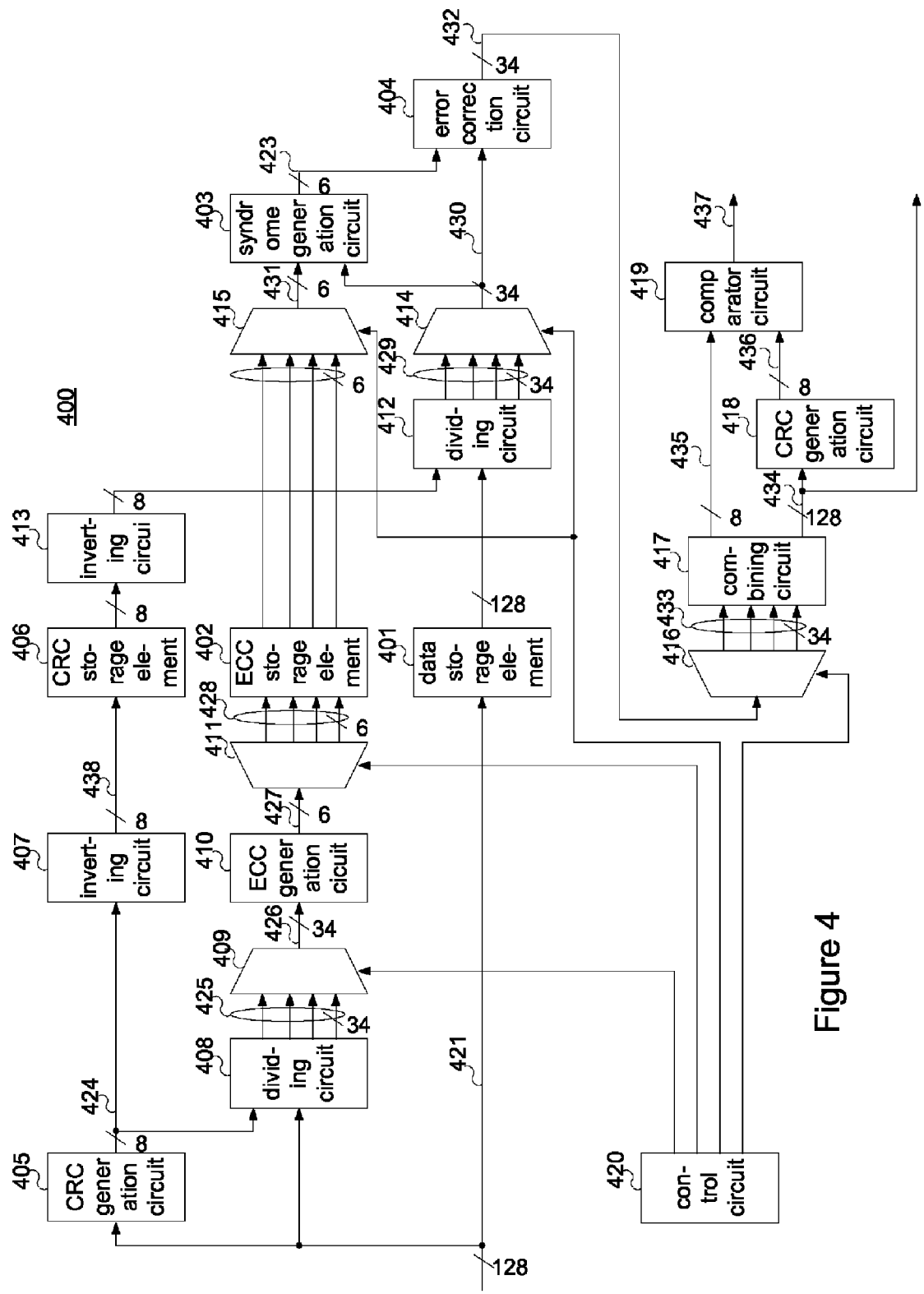
FIG. 4 is a schematic of an embodiment of the main parts of an apparatus for permanent storage of a 128-bit data word according to the present invention.

Referring to FIG. 4 the schematic of the main parts of an apparatus 400 for permanent storage of a 128-bit data word is shown. The 128-bit input data 421 is stored permanently in data storage elements 401. An 8-bit CRC code 424 is computed by a CRC generation circuit 405 based on the 128-bit input data 421. The CRC code 424 is stored in CRC storage elements 406. As described above the CRC code 424 can be used to decrease the probability of undetected programming errors of data storage elements 401. The CRC code 424 may be inverted in an inverting circuit 407 and the inverted 8-bit CRC code 438 may be stored in the CRC storage elements 406. As described above the inversion can be used to neutralize the effects of a complete programming failure of the storage elements.

Dividing circuit 408 combines the 128-bit input data 421 and the 8-bit CRC code 424, 438 and divides the resulting 136-bit string into four sub-strings 425 of equal length of 34 bits. A multiplexer 409 selects one of the four sub-strings 425 and outputs the selected sub-string 426. Based on the selected sub-string 426 a 6-bit ECC code 427 is generated by the ECC generation circuit 410. This ECC code can be a SEC code. A demultiplexer 411 takes the single input ECC code 427 and connects it to one of four 6-bit output lines 428. By this, for each of the four sub-strings 425 a corresponding 6-bit ECC code 428 is generated. The four 6-bit ECC codes 428 are stored in ECC storage elements 402. The ECC codes are based on both the input data word 421 and the corresponding CRC code 424. Thus it is possible to correct an error not only for erroneously programmed data storage elements 401 but also for erroneously programmed CRC storage elements 406.

For read-out and correction of the data storage elements 401 a dividing circuit 412 combines the content of the data storage elements 401 and the CRC storage elements 406 and divides the resulting 136-bit string into four sub-strings 429 of equal length of 34 bits. A multiplexer 414 selects one of the four sub-strings 429 and outputs the selected sub-string 430. If the inverted CRC code 438 is stored in the CRC storage elements 406 the inverted content of the CRC storage elements 406 needs to be combined in the dividing circuit 412. For the inversion a separate inverting circuit 413 may be used. Alternatively, the inverting circuit 407 may be configured so that it performs both the inversion of the CRC code 424 and the inversion of content of the CRC storage element 406 in one circuit.

The multiplexer 415 receives the content of the ECC storage elements 402 and selects one of the four 6-bit ECC codes. Based on the selected ECC code 431 and the corresponding selected sub-string 430 a 6-bit wide syndrome 423 is generated. The generation of the syndrome 423 may be performed by a separate syndrome generation circuit 403. Instead, the apparatus 400 may be configured in a way that the ECC code 427 and the syndrome 423 may be generated by a shared circuit.

In error correction circuit 404 the syndrome 423 is used to determine whether one or more bit errors have occurred in the storage elements that correspond to the sub-string 430. The sub-string 430 may contain the content of data storage elements 401 or the content of CRC storage elements 406. Depending on the ECC code scheme one or more errors can be corrected by the error correction circuit 404. A demultiplexer 416 takes a corrected 34-bit sub-string 432 connects it to one of four 34-bit output lines 433. A combining circuit 417 combines the four 34-bit output lines and provides a corrected 128-bit data word 434 as output of the apparatus 400. Furthermore a corrected 8-bit CRC code 435 is provided by the combining circuit 417.

In order to increase the error detection capabilities of the apparatus 400 the corrected 8-bit CRC code 435 may be compared with a CRC code 436 that is computed by a CRC generation circuit 418 based on the corrected 128-bit data word 434. The CRC generation circuit 418 may be separate circuit or it may be shared circuit. For shared circuit the CRC code 424 that is based on the 128-bit input data 421 is generated by the same circuit as the CRC code 436 that is based on the corrected 128-bit data word 434. In a comparator circuit 419 the corrected CRC code 435 is compared with the CRC code 436 and an error flag 437 indicates whether one or more errors were detected in the corrected data word 434 or in the corrected CRC code 435. Consequently the error flag 437 denotes if the number of storage elements that are programmed erroneously is higher than the number of errors that can the corrected by the ECC code schema.

A control circuit 420 controls the multiplexers and demultiplexers of apparatus 400.

The apparatus 400 may be configured in a way that the multiplexers 409, 414, 415 and the demultiplexer 411 are not needed. Instead, the number of ECC generation circuitries 410 and syndrome generation circuitries 403 is multiplied by the number of sub-strings. As a consequence there is a dedicated ECC generation circuit and syndrome generation circuit for each sub-string. For apparatus 400 there may be four ECC generation circuitries and four syndrome generation circuitries. By multiplying the number of ECC and syndrome generation circuits on the one hand the operation speed of apparatus 400 may be increased. On the other hand the complexity and the total implementation overhead of apparatus 400 may be increased.

In FIG. 4 the dividing circuit 408 may be configured in a way that it divides 34 consecutive bits of the input data into one sub-string. In cases where faults in the programming of the storage elements tend to be close to each other the probability of having several errors for one sub-string rises. In order to reduce the probability of having several errors for one sub-string the dividing circuit 408 may be configured in a way that it assigns adjacent bits of the input data to different sub-strings.

Figure 5:
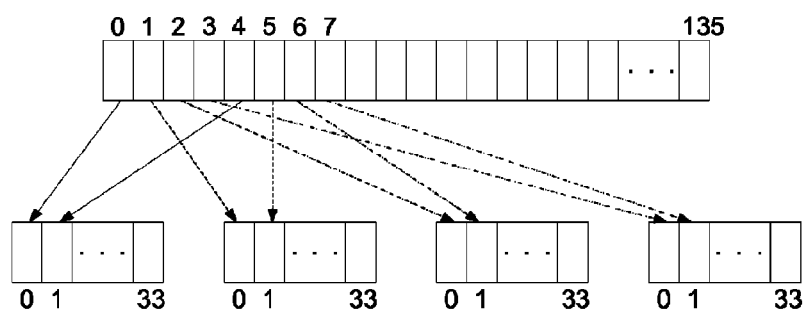
FIG. 5 shows an embodiment of a dividing circuit that partitions adjacent bits of an input data and a CRC code into different sub-strings according to the present invention.

Referring to FIG. 5 part of the dividing circuit 408 is shown where adjacent bits of the input data and the CRC code, respectively, are partitioned into different sub-strings. A 136-bit string combines the 128-bit input data and the 8-bit CRC code. The combined 136-bit string is divided into four sub-strings of equal length of 34 bits. The first bit of the string is assigned to the first sub-string, the second bit of the string is assigned to the second sub-string, the third bit of the string is assigned to the third sub-string and the fourth bit of the string is assigned to the fourth sub-string. The fifth bit of the string is again assigned to the first sub-string, the sixth bit of the string is again assigned to the second sub-string and so on. With the help of the bit assignment described above an ECC code 427 is generated based the data that is written to non-adjacent storage elements 401, 402. As a result the apparatus 400 is more robust against fault clustering in the programming of the storage elements 401, 402.

Figure 6:
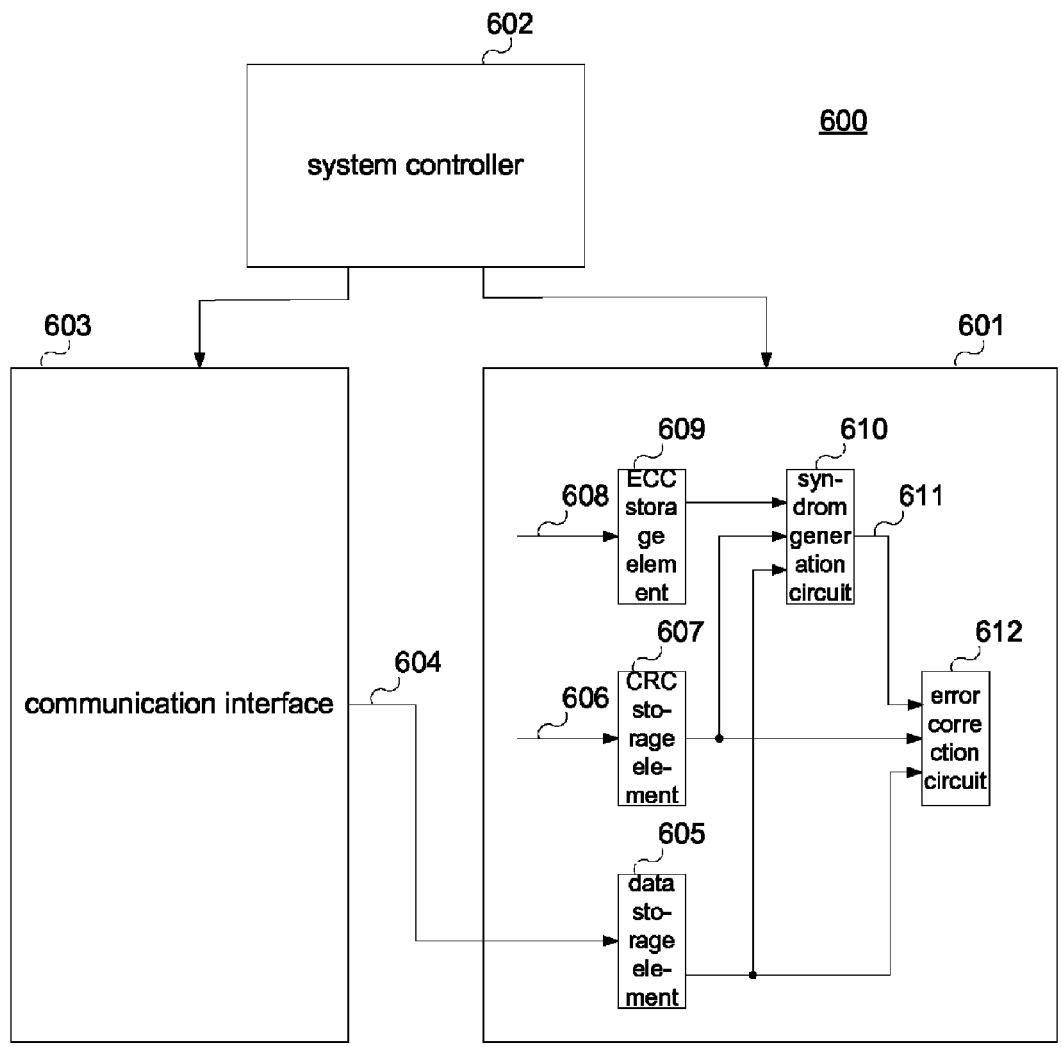
FIG. 6 shows an embodiment of a system which comprises an integrated circuit device, a system controller and a communication interface according to the present invention.

Referring to FIG. 6 a system 600 is shown which comprises an integrated circuit device 601, a system controller 602 and a communication interface 603. The integrated circuit device 601 receives data 604 and stores the data 604 permanently in a data storage element 605. A CRC code 606 is computed based on the data 604 and the CRC code 606 is stored in a CRC storage element 607. An ECC code 608 is computed based on the data 604 and the CRC code 606 and the ECC code 608 is stored in an ECC storage element 609. In syndrome generation circuit 610 a syndrome 611 is generated based on the contents of the data storage element 605, the CRC storage element 607 and the ECC storage element 609. The syndrome 611 thus generated is used in an error correction circuit 612 to determine whether one or several bit errors have occurred in the data storage element 601 and in the CRC storage element 602 and to correct the one or more errors.

The communication interface 603 is configured to transfer the data 604 to the integrated circuit device 601. The data transfer from the communication interface 603 to the integrated circuit device 601 is performed in accordance with the system controller 602. In a microprocessor system the communication interface 603 may be connected to a microcontroller and the system controller 602 may be part of the microcontroller logic. The communication interface 603 may be connected to or be part of a user interface. In a personal computer or in a mobile phone the user interface may be connected to a keypad or a touch-screen terminal.

Figure 7:
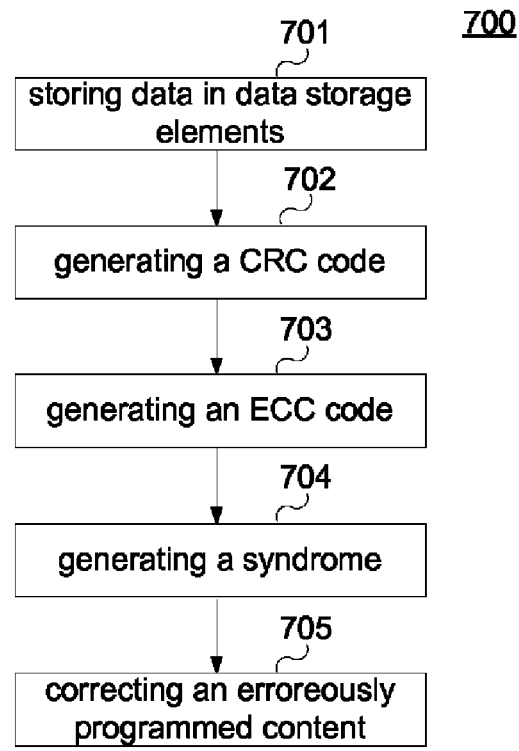
FIG. 7 and FIG. 8 illustrate methods of storing data permanently according to the present invention.

FIG. 7 illustrates a method 700 of storing data permanently. At 701, the method includes storing data in data storage elements to store the data permanently. At 702, the method includes generating a CRC code for the data and storing the CRC code in CRC storage elements. At 703, the method includes generating an ECC code for the data and the CRC code and storing the ECC code in ECC storage elements. At 704, the method includes generating a syndrome based on the content of the data, CRC and ECC storage elements. At 705, the method includes correcting an erroneously programmed content of the data and CRC storage elements based on the syndrome.

The method 700 may also comprise generating a further CRC code based on the corrected content of the data storage elements and comparing the further CRC code against the corrected content of the CRC storage elements to detect whether the data and/or CRC storage elements are programmed erroneously. Furthermore, the method 700 may also comprise inverting the CRC code and the further CRC code.

Figure 8:
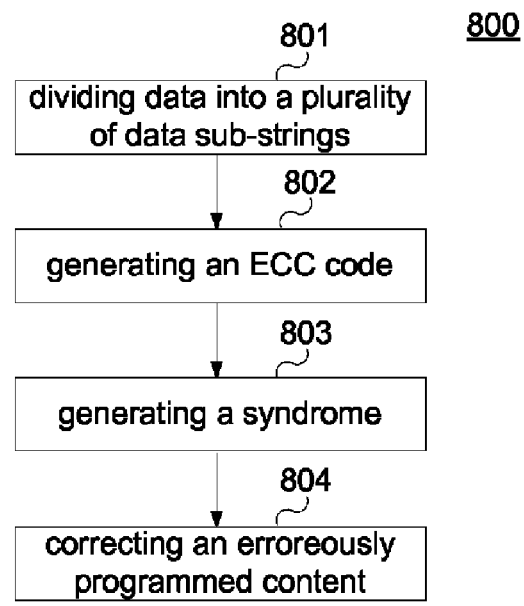

Referring to FIG. 8 an alternative method 800 of storing data permanently is shown. At 801, the method includes dividing data into a plurality of data sub-strings and storing the data sub-strings in data storage elements. At 802, the method includes generating an ECC code for the data sub-strings and storing the ECC codes in ECC storage elements. At 803, the method includes generating a syndrome based on the content of the data and ECC storage elements and at 804, the method includes correcting an erroneously programmed content of the data storage elements based on the syndrome.

The method 800 may also comprise generating a CRC code for the data and storing the CRC code in CRC storage elements. Furthermore, the method 800 may comprise inverting the CRC code.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The storage elements of the embodiments described above may be volatile memories, non-volatile memories like flash memories or one-time programmable storage elements like laser fuses or electrical fuses (efuses). The fuses may be used as redundancy elements in an embedded memory configuration. Alternatively the fuses may be used for trimming of circuits, e.g. bandgap reference circuits, or for programming the secret key of a cryptographic module or for programming of an identification number.

Laser Fuses need to be programmed by a dedicated laser source. In contrast to that, efuses can be programmed by pure electrical means, e.g. by applying an adequately high voltage on the voltage pin of an integrated circuit containing efuses. Consequently the programming of efuses can take place on the same tester where the wafer containing the integrated circuit gets tested productively. Alternatively, efuses may be programmed in the field in case that the information to be stored is not known at the time of production time or when the customer wants to store chip-specific data directly at his site or within the final application. A programming failure at such late stage may imply the need to discard the entire product or system. In such a case it is a requirement to avoid fuse programming failures and to have means to correct programming failures.

The apparatus of the embodiments described above may be implemented on a single semiconductor device. However it is also possible that the implementation of the apparatus is spread on several semiconductor devices. Parts of the apparatus may not be implemented by hardware, e.g. the generation of the CRC code and the ECC code may be performed by software.

The invention claimed is:

1. Apparatus, comprising:
   a first storage element storing data;
   a second storage element storing a cyclic redundancy code generated for the data;
   a third storage element storing an error correcting code generated for the data and for the cyclic redundancy code;
   a first circuit configured to generate a syndrome based on the content of the first, second and third storage elements; and
   a second circuit configured to correct an erroneously programmed content of the first and second storage elements based on the syndrome.

2. The apparatus of claim 1, further comprising a third circuit configured to generate the error correcting code for the data and the cyclic redundancy code.

3. The apparatus of claim 1, wherein the first circuit is further configured to generate the error correcting code for the data and the cyclic redundancy code.

4. The apparatus of claim 1, further comprising a fourth circuit configured to generate the cyclic redundancy code for the data.

5. The apparatus of claim 4, further comprising a fifth circuit to invert the cyclic redundancy code.

6. The apparatus of claim 4, wherein the fourth circuit is further configured to generate a further cyclic redundancy code based on the corrected content of the first storage element.

7. The apparatus of claim 1, further comprising a sixth circuit configured to generate a further cyclic redundancy code based on the corrected content of the first storage element and a seventh circuit to compare the further cyclic redundancy code against the corrected content of the second storage element to detect whether the first storage element is programmed erroneously.

8. The apparatus of claim 1, wherein the first, second and third storage elements comprise fuses.

9. A method, comprising:
   storing data in first storage elements;
   generating a cyclic redundancy code for the data and storing the cyclic redundancy code in a second storage elements;
   generating an error correcting code for the data and for the cyclic redundancy code and storing the error correcting code in third storage elements;
   generating a syndrome based on the content of the first, second and third storage elements; and
   correcting an erroneously programmed content of the first and second storage elements based on the syndrome.

10. The method of claim 9, further comprising:
    generating a further cyclic redundancy code based on the corrected content of the first storage elements; and
    comparing the further cyclic redundancy code against the corrected content of the second storage elements to detect whether the first storage elements and/or the second storage elements are programmed erroneously.

11. The method of claim 10 further comprising:
    inverting the cyclic redundancy code and the further cyclic redundancy code.

12. A system, comprising:
    a system controller;
    an integrated circuit device with a first storage element for storing data permanently, with a second storage element programmable with a cyclic redundancy code generated for the data, including a third storage element programmable with an error correcting code generated for the data and for the cyclic redundancy code, including a first circuit configured to generate a syndrome based on the first, second and third storage elements and including a second circuit configured to correct an erroneously programmed content of the first and second storage elements based on the syndrome; and
    a communication interface in communication with the integrated circuit device configured to transfer the data to the integrated circuit device in accordance with the system controller.

* * * * *